United States Patent [19]
Fujii

[11] Patent Number: 5,917,745
[45] Date of Patent: Jun. 29, 1999

[54] SEMICONDUCTOR MEMORY DEVICE

[75] Inventor: Yasuhiro Fujii, Kawasaki, Japan

[73] Assignee: Fujitsu Limited, Kanagawa, Japan

[21] Appl. No.: 09/040,365

[22] Filed: Mar. 18, 1998

[30] Foreign Application Priority Data

Sep. 18, 1997 [JP] Japan ................................. 9-253907

[51] Int. Cl.⁶ ............................................. G11C 5/06
[52] U.S. Cl. ............................ 365/63; 365/149; 365/205; 365/206
[58] Field of Search .................. 365/51, 63, 72, 365/149, 205, 206

[56] References Cited

U.S. PATENT DOCUMENTS

| | | | |
|---|---|---|---|
| 5,495,440 | 2/1996 | Asakura | 365/149 |
| 5,561,626 | 10/1996 | Fujii | 365/149 |
| 5,682,343 | 10/1997 | Tomishima et al. | 365/63 |
| 5,715,189 | 2/1998 | Asakura | 365/72 |
| 5,757,692 | 5/1998 | Suh | 365/149 |

FOREIGN PATENT DOCUMENTS 7-111083  4/1995  Japan ........................... G11C 11/34

*Primary Examiner*—Son Mai
*Attorney, Agent, or Firm*—Nikaido Marmelstein Murray & Oram, LLP

[57] ABSTRACT

A semiconductor memory device according to this invention has a hierarchical bit line structure where a plurality of local bit lines are provided in parallel to each global bit line and some of the local bit lines in the column direction are connected to the global bit line. Such memory device further has an open bit line structure where global bit lines are provided on both sides of sense amplifiers, and has bit-line transfer circuits, provided between the global bit lines and the sense amplifiers, for isolating the global bit lines from the sense amplifiers when the sense amplifiers are activated. The use of the hierarchical bit line structure in combination with the open bit line structure enhances the layout efficiency of memory cells, and the provision of the bit-line transfer circuits overcomes a problem of erroneous data reading which would otherwise be caused by bit line noise inherent to the open bit line structure.

8 Claims, 16 Drawing Sheets

MEMORY CELL OF DRAM

| FIG.6a |
|--------|
| FIG.6b |

| FIG.13a |
| FIG.13b |

SEMICONDUCTOR MEMORY DEVICE

BACKGROUND OF THE INVENTION

1. Field of the Invention

The present invention relates to a semiconductor memory device, and, more particularly, to a novel structure of a dynamic random access memory (DRAM) with a hierarchical bit line structure.

2. Description of the Related Art

DRAMs are very popular as a fast access memory with a large capacity for use as a CPU s cache memory. To ensure an ever-increasing capacity, the size of memory cells should be made smaller. This structure increases the number of memory cells to be connected to a single bit line and expanding the capacity of bit lines. In existing DRAMs which store data of 1 or 0 by the presence or absence of charges, reducing the size of memory cells and increasing the bit line capacity make smaller a minute voltage to be read on a bit line and makes the sensing of sense amplifiers difficult. Further, an increase in the load capacity of bit lines increases the power dissipation that is caused by driving the bit lines.

As a solution to this shortcoming has been proposed a hierarchical bit line structure in which each bit line consists of a global bit line and a plurality of local bit lines connectable to the global bit line. In this structure, memory cells are located at intersections of word lines and local bit lines and those local bit lines which correspond to a selected word line are connected to the associated global bit lines. This reduces the entire capacity of the bit lines to be connected to sense amplifiers. Further, the provision of a plurality of local bit lines in parallel to each global bit line can secure sufficient pitches between the global bit lines and also secure sufficient space for the sense amplifiers that are connected to the global bit lines. This can ensure high integration.

There is a known semiconductor memory device of a folded bit line type in which pairs of bit lines to be connected to sense amplifiers are laid out in parallel. This bit line system is known to be unsusceptible to noise on the bit lines at the time of reading data. It is expected that the use of the above-described hierarchical bit line structure in the folded bit line system provides a noise unsusceptible structure with a larger capacity.

The use of the hierarchical bit line structure in the folded bit line system however allows only a single memory cell to be laid along a word line with respect to two sets of a plurality of local bit lines, each set provided in parallel to a single global bit line and connected to a sense amplifier. This is because that the folded bit line system requires that a memory cell should be laid on one of a pair of global bit lines along a word line. Therefore, the employment of the hierarchical bit line structure in the folded bit line system is not a preferable choice from the viewpoint of the layout efficiency of memory cells.

It is thus desirable from the viewpoint of the layout efficiency of memory cells to use the hierarchical bit line structure in an open bit line system. The present inventor has proposed a similar memory in a Japanese patent application filed on Mar. 4, 1996 and later laid open as Unexamined Japanese Patent Publication No. Hei 8-45712.

The open bit line system however has a problem on noise of bit lines which occurs in the amplifying operation of sense amplifiers at the time of reading data. When most of the bit lines laid on one side of the sense amplifiers read, for example, "0" and a very few read "1," the potentials of most bit lines are set to an L level simultaneously in accordance with the amplifying operation of the sense amplifiers. This causes the very few bit lines that are reading "1" to be influenced by L-level noise.

Any memory, which employs a hierarchical bit line structure in order to increase the margin for sense amplifiers to meet significant capacity expansion, should avoid this noise problem. As has been discussed above, it is difficult to realize a memory which is unsusceptible to noise on bit lines at the time of data reading while maintaining the area efficiency of memory cells to ensure huge capacity.

Accordingly, it is an object of the present invention to provide a semiconductor memory device which is suitable for accomplishing vast capacity with less dissipation power and is capable of ensuring a large operational margin in read mode.

It is another object of this invention to provide a semiconductor memory device with a hierarchical bit line structure which can ensure a large operational margin in read mode.

SUMMARY OF THE INVENTION

To achieve the above objects, a semiconductor memory device according to this invention has a hierarchical bit line structure where a plurality of local bit lines are provided in parallel to each global bit line and some of the local bit lines in the column direction are connected to the global bit line. Such memory device further has an open bit line structure where global bit lines are provided on both sides of sense amplifiers, and has bit-line transfer circuits, provided between the global bit lines and the sense amplifiers, for isolating the global bit lines from the sense amplifiers when the sense amplifiers are activated.

The use of the hierarchical bit line structure in combination with the open bit line structure enhances the layout efficiency of memory cells, and the provision of the bit-line transfer circuits overcomes a problem of erroneous data reading which would otherwise be caused by bit line noise inherent to the open bit line structure.

The semiconductor memory device of this invention further comprises global-bit-line reset circuits with a high driving performance provided on the global bit lines, and local-bit-line reset circuits with a low driving performance provided on the local bit lines. The global-bit-line reset circuits set the connected global bit lines and local bit lines to a reset level, and the local-bit-line reset circuits keep the local bit lines at the reset level. This structure can allow only the local bit lines connected to the memory cells on a selected word line to be connected to the associated global bit lines so as drive such local bit lines after the amplifying operation of the sense amplifiers, thereby suppressing a wasteful bit-line drive current. The non-selected local bit lines are kept at the reset level by the local-bit-line reset circuits.

To achieve the above objects, a semiconductor memory device according to this invention comprises:

a plurality of word lines extending in a row direction;
 a plurality of global bit lines extending in a column direction;
 local bit lines belonging to the global bit lines and divided into groups in the column direction, a plurality of local bit lines being arranged in the row direction with respect to each global bit line;
 a plurality of memory cells provided at intersections of the word lines and the local bit lines;

a plurality of sense amplifiers each for comparing signal levels of an associated pair of global bit lines located on both sides thereof in the column direction;

bit-line transfer circuits, provided between the global bit lines and the sense amplifiers, for isolating the global bit lines from the sense amplifiers when the sense amplifiers are driven;

global-bit-line reset circuits, respectively provided for said global bit lines, for driving said global bit lines to a reset level; and local-bit-line reset circuits, respectively provided for said local bit lines, for driving said local bit lines to said reset level, wherein said global-bit-line reset circuits drive local bit lines to be connected to memory cells on a selected word line to said reset level.

DETAILED DESCRIPTION OF THE PREFERRED EMBODIMENTS

Preferred embodiments of the present invention will now be described with reference to the accompanying drawings. It should however be noted that those embodiments are to be considered as illustrative and not restrictive and the invention is not to be limited to the details given hereunder, but may be modified within the scope of the appended claims.

Schematic Structure

Figure 1:
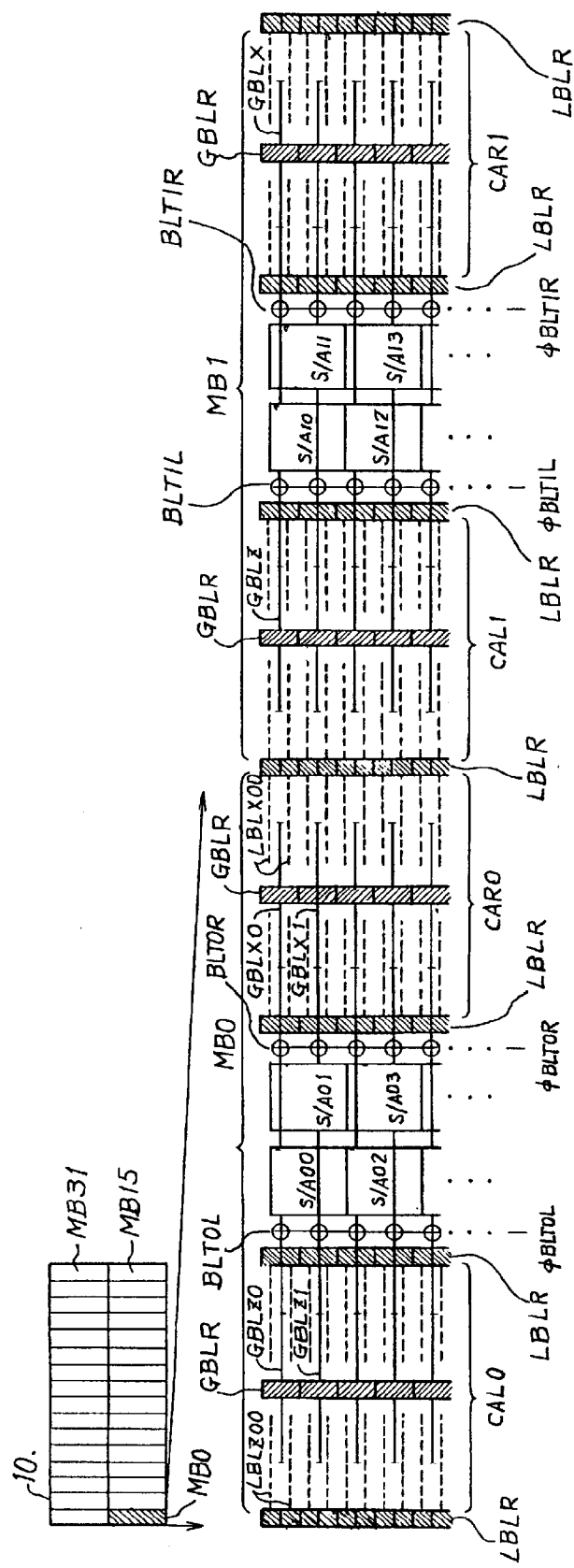
FIG. 1 is a schematic structural diagram of one embodiment of this invention.

FIG. 1 is a schematic structural diagram of one embodiment of this invention. A chip 10 on which a memory is formed comprises a plurality of memory blocks MB0 to MB31. Each memory block includes word lines, bit lines, memory cells at the intersection of both lines, and sense amplifiers. FIG. 1 shows two memory blocks MB1 and MB2 in enlargement. For illustrative simplicity, the word lines and memory cells are not shown.

With regard to the block MB0 at the lower left end, the bit lines have a hierarchical structure with global bit lines (main bit lines) GBLZx and GBLXx and a plurality of local bit lines (sub bit lines) LBLZxx and LBLXxx belonging to the former bit lines GBLZx and GBLXx. The global bit lines GBLZx and GBLXx extending to left and right cell arrays CALx and CARx are respectively connected to common sense amplifiers S/A00 to S/A03. The sense amplifiers S/A00–S/A03 are formed in two lines in the column direction. The sense amplifiers thus have the size that matches with the pitch between two global bit lines. Accordingly, a pair of global bit lines GBLZ0 and GBLX0 are connected to the sense amplifier S/A00, and an adjoining pair of global bit lines GBLZ1 and GBLX1 are connected to the sense amplifier S/A01.

The sense amplifiers S/A00–S/A03 apparently has a layout of a so-called relax sense amplifier type. That is, the width of two global bit lines matches with the width of each sense amplifier. The sense amplifiers S/A00–S/A03 are laid out in two columns. Thus, the width of four local bit lines matches with the width of a sense amplifier. Since two local bit lines LBLZxx and LBLXxx are laid in parallel with respect to a single global bit line, a single memory cell can be laid out along a word line with respect to two local bit lines as will be discussed later. This layout of memory cells can improve the layout efficiency. It is thus possible to keep a high layout efficiency of memory cells to implement a huge memory capacity.

In the structure shown in FIG. 1, bit-line transfer gates BLTxL and BLTxR are respectively provided between the global bit lines GBLZx and GBLXx and the sense amplifiers S/A. In read mode, the bit-line transfer gates isolate the sense amplifiers S/A from the associated global bit lines to prevent noise from appearing on the bit lines when the sense amplifiers perform the amplifying operation. In write mode, the bit-line transfer gates also isolate the sense amplifiers S/A from the associated global bit lines to reduce the inverting load of the sense amplifier for write amplifiers. This system of separating the global bit lines from the sense amplifiers can overcome the aforementioned conventional problem of noise on the bit lines in the case of the open bit line structure, and can avoid the noise problem in read mode while increasing the layout efficiency of memory cells to ensure a vast memory capacity. This system can therefore be said to be most suitable for the hierarchical bit line system.

In the structure shown in FIG. 1, reset circuits GBLR for setting the global bit lines GBLZx and GBLXx to a reset level are arranged at the center of the associated cell arrays CALx, CARx. The layout of a plurality of local bit lines for a global bit line provides a sufficient pitch between the global bit lines to secure space to place each reset circuit at the center of the associated cell array. This structure also has reset circuits LBLR respectively provided for the local bit lines. As will be discussed later, transfer transistors of as small a size as to pass a minute current are used for the reset circuits LBLR for the local bit lines to avoid wasteful current consumption by short-circuiting, failure or the like of the local bit lines.

The provision of the reset circuits for both the global bit lines and local bit lines can allow only a selected local bit line and global bit line to be driven by the associated sense amplifier while keeping the non-selected local bit lines at the reset level. It is therefore possible to decrease the bit-line drive current necessary along to the activation of the bit lines. In standby mode, the individual local bit lines can be reset while a local-bit-line selector which connects a local bit line to the associated global bit line is left inactive. This can suppress the drive current of the local-bit-line selector.

Further, the global bit lines are cut at farthest connection points from the sense amplifiers between the local bit lines and global bit lines in the structure shown in FIG. 1. This reduces the capacity of the global bit lines. Furthermore, as mentioned above, the bit lines to be connected to the sense amplifiers can be limited to the global bit lines and the local bit lines to which selected memory cells belong. This, together with the aforementioned cut, significantly reduces the total capacity of the bit lines to be connected to the sense amplifiers.

Figure 2:
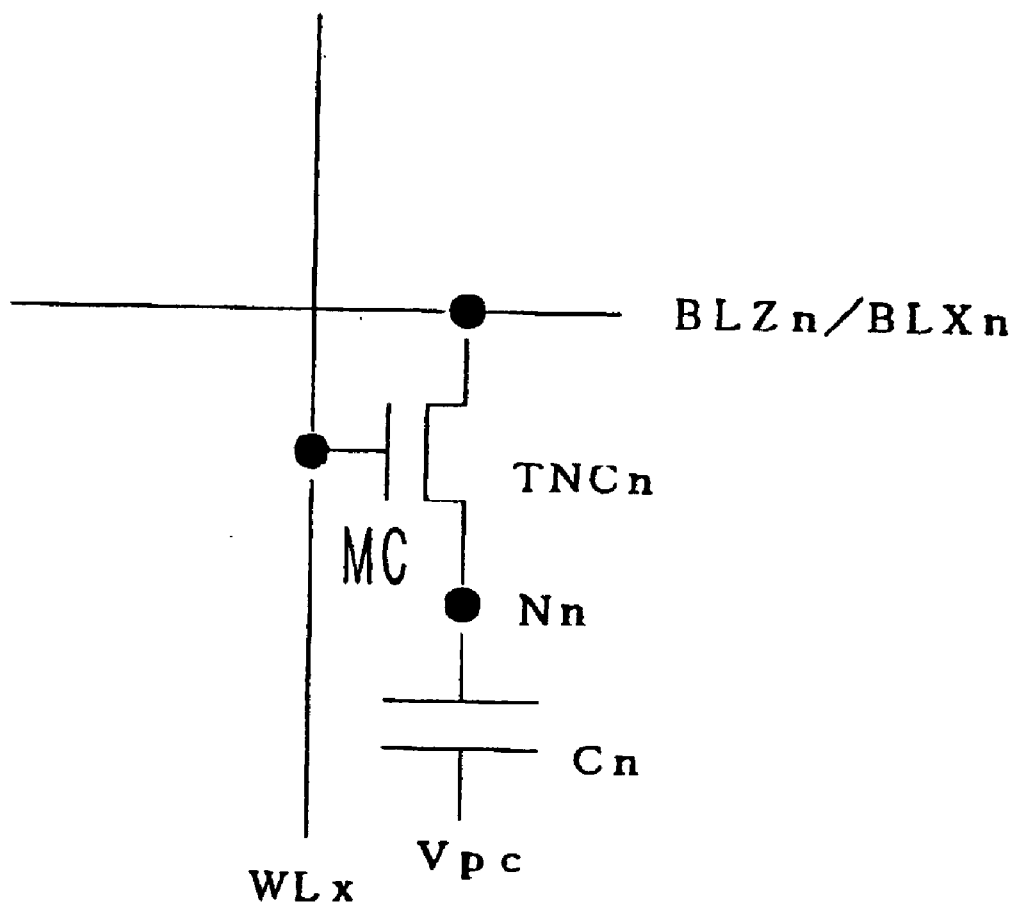
FIG. 2 is a circuit diagram of a memory cell in a typical DRAM.

FIG. 2 is a circuit diagram of a memory cell in a typical DRAM. A memory cell MC, provided at the intersection of a bit line BLZn/BLXn and a word line WLx, has a cell transfer transistor TNCn and a cell capacitor Cn and stores data at a cell node Nn. The opposite end of the capacitor Cn is connected to a cell opposing electrode (cell plate) Vpc.

Figure 3:
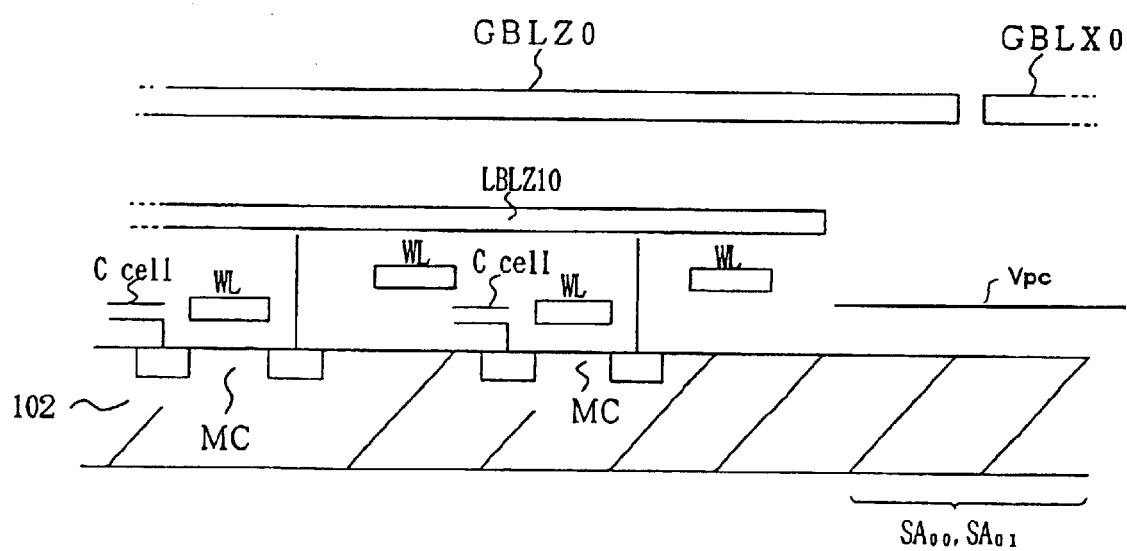
FIG. 3 is a cross-sectional view schematically showing the hierarchical structure of bit lines.
Figure 4:
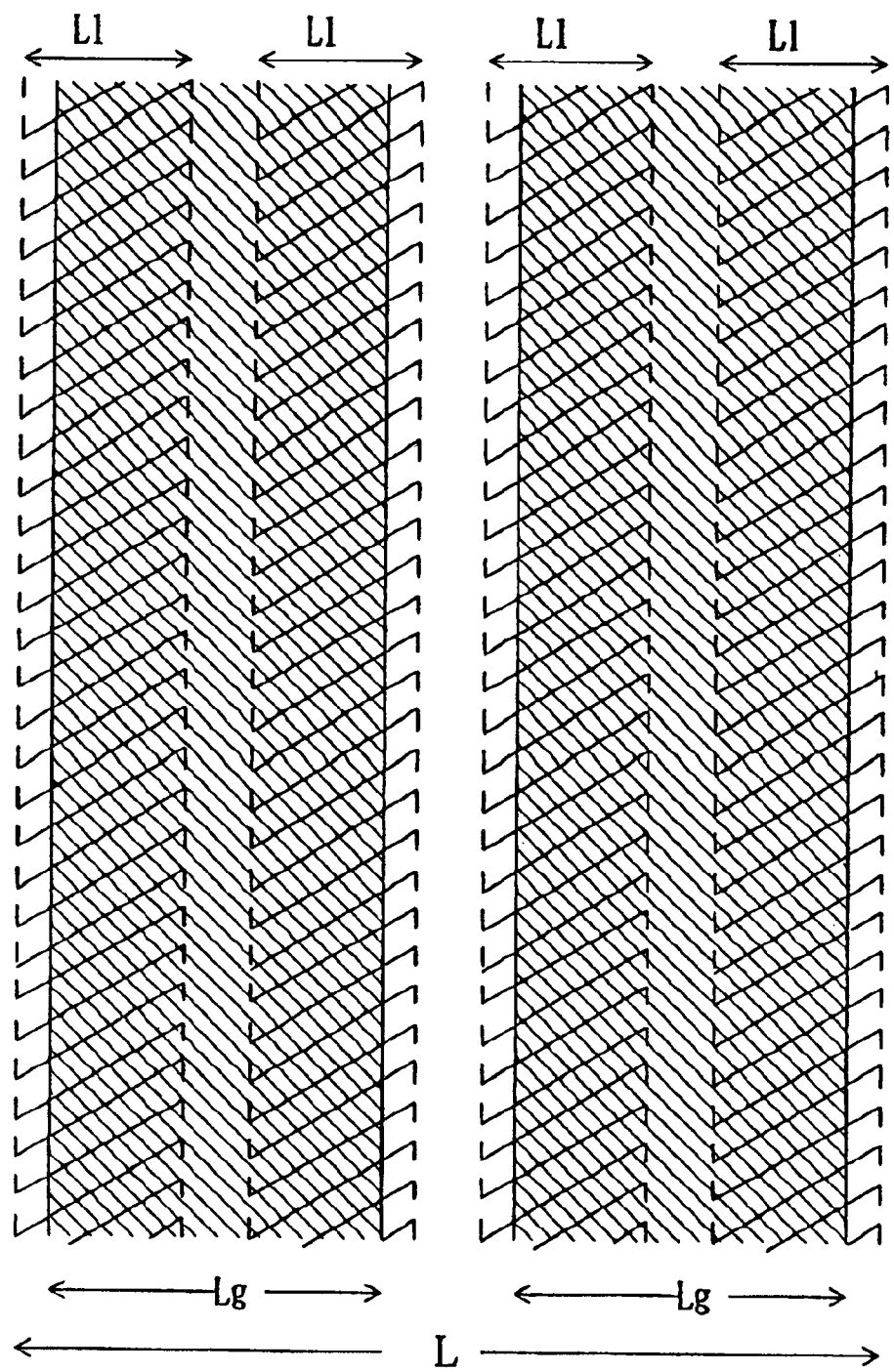
FIG. 4 is a plan view schematically depicting the bit line hierarchical structure.
Figure 5:
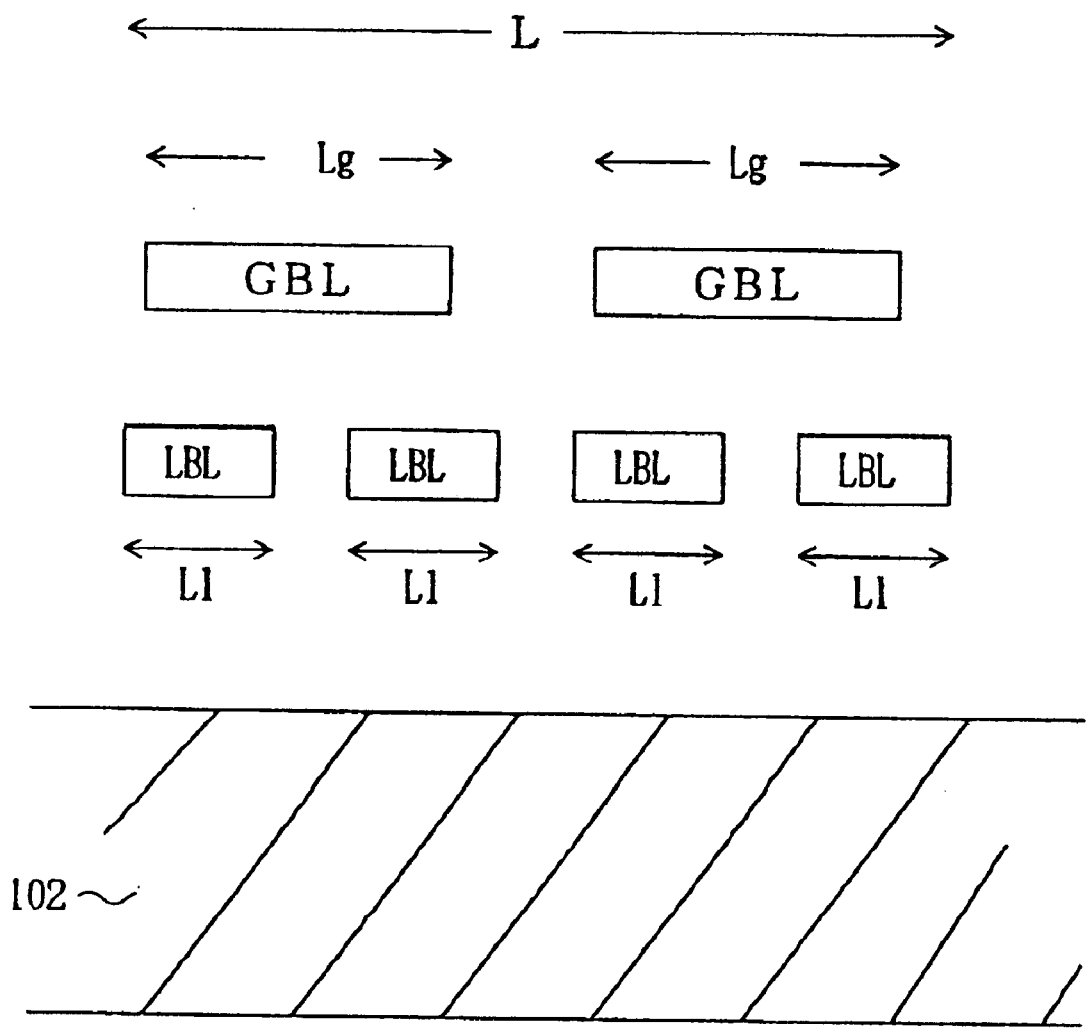
FIG. 5 is a cross-sectional view schematically illustrating the bit line hierarchical structure.

FIGS. 3, 4 and 5 are a cross-sectional view, a plan view and a cross-sectional view schematically illustrating the hierarchical structure of the bit lines. FIG. 3 schematically shows the hierarchical structure of memory cells MC, sense amplifiers SA, word lines WL, a local bit line LBLZ10, and global bit lines GBLZ0 and GBLX0 on a semiconductor substrate 102. As mentioned above, each memory cell MC comprises a transistor TNCn with a gate which the word line will become, and a cell capacitor Ccell. The individual memory cells MC are connected to the underlying local bit line LBLZ10 which is connected to the overlying global bit line GBLZ0 via an unillustrated select transistor. Therefore, the area for the sense amplifiers $SA_{00}$ and $SA_{01}$ is located under the global bit line and raises no structural problem. That is, the hierarchical bit line structure is suitable for the layout of a relax sense amplifier type. Provided between the sense amplifiers $SA_{00}$ $SA_{01}$ and the global bit line is a material, which forms the cell plate Vpc, to shield both from each other.

FIG. 4 is a plan view showing a relationship between global bit lines and local bit lines, and FIG. 5 is a cross-sectional view of FIG. 4. As apparent from both figures, the hierarchical bit line to be formed on the semiconductor substrate 102 comprises overlying global bit lines GBL formed of metal of a low resistance like tungsten or aluminum, and underlying interconnection layers of local bit lines LBL formed of a material of a relatively high resistance, such as polysilicon or polycide, which is suitable for a minuite fablication. According to this invention, two local bit lines LBL are laid under a single global bit line GBL. The width L of the sense amplifier area is equivalent to about two times the width Lg of the local bit line, which is equivalent to about two times the width L1 of the global bit line. This can permit the local bit lines to be laid out in accordance with the density of the memory cells which is determined by the size of the large capacity demanded. The global bit lines are laid, one per two closely laid local bit lines. As mentioned above, the sense amplifiers are arranged, one per two global bit lines.

First Embodiment

Figures 6, 6A:
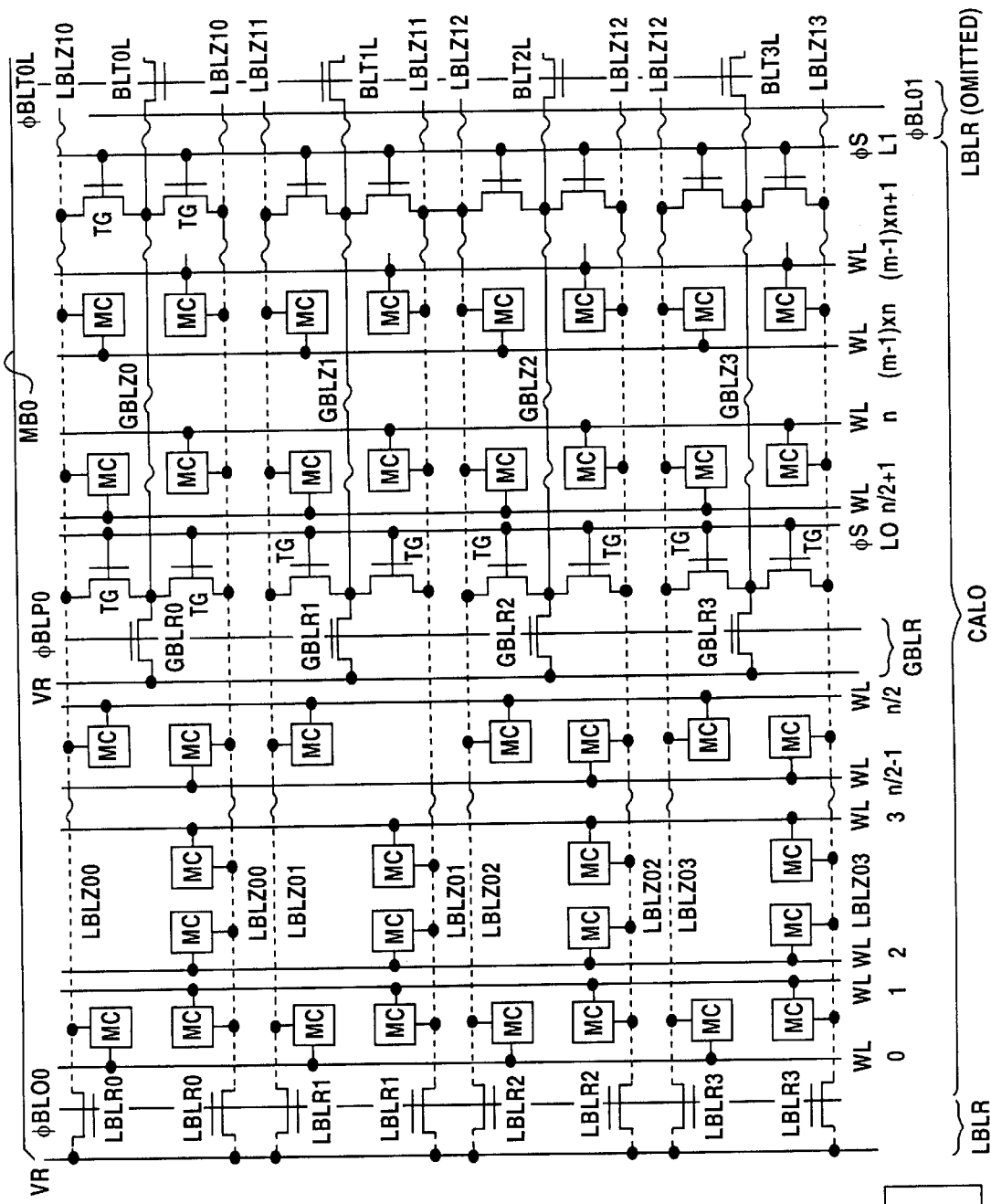
FIG. 6 is a diagram of a memory circuit according to a first embodiment.
Figure 6B:
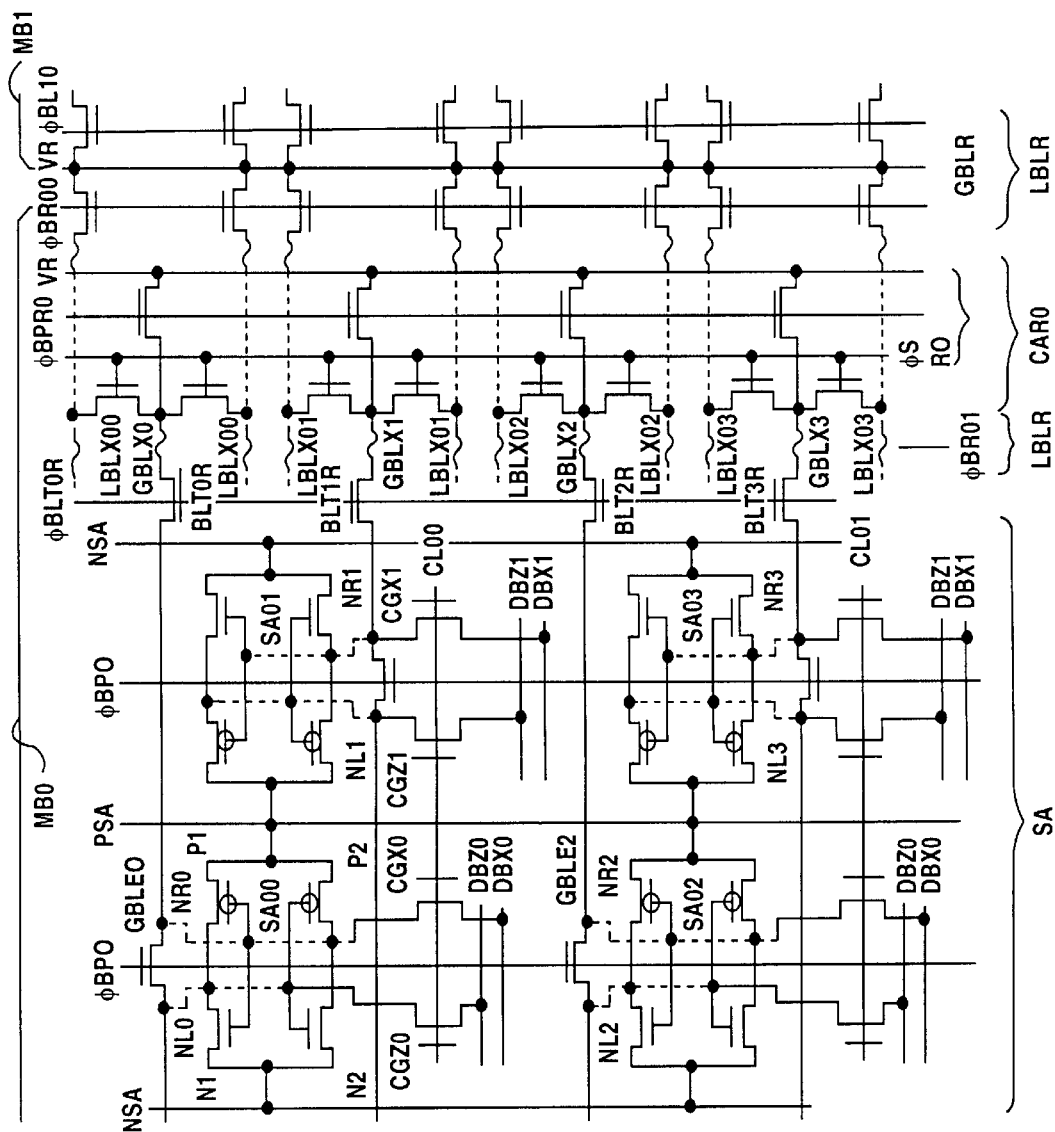

FIG. 6 is a diagram depicting a memory circuit according to the first embodiment. FIG. 6 presents a detailed illustration of the memory block MB0 in FIG. 1, particularly the left cell array CAL0 and the sense amplifier section SA. The solid lines in the figure indicate the aforementioned metal lines, and the broken lines indicate the lines of polysilicon, polycide or the like.

FIG. 6 shows four columns of portions, with four global bit lines GBLZ0 to GBLZ3 located on the left cell array CAL0 and four global bit lines GBLX0 to GBLX3 on the right cell array CAR0. The sense amplifier section SA is located between both cell arrays. The sense amplifier SA00 is provided for the pair of global bit lines GBLZ0 and GBLX0. Likewise, the sense amplifiers SA01 to SA03 are provided for the global bit line pairs GBLZ1 and GBLX1, GBLZ2 and GBLX2, and GBLZ3 and GBLX3.

Bit-line transfer transistors BLT are provided between the sense amplifiers SAxx and the global bit lines GBLZx and between the sense amplifiers SAxx and the global bit lines GBLXx. Each transfer transistor BLT is controlled by a bit-line transfer signal BLT0L or BLT0R. This bit-line transfer signal can separate the global bit line from the associated sense amplifier SA before the sense amplifier is enabled. The separation can likewise be conducted in write mode.

As apparent from the sense amplifier SA00 for the global bit lines GBLZ0 and GBLX0, for example, each sense amplifier is constituted of a CMOS differential amplifier comprising transistors P1, N1, P2 and N2, and is enabled by a sense amplifier drive signal PSA or NSA. Column gates CGZ0 and CGX0 are rendered conductive by column select signals CLxx, causing the sense amplifiers to be connected to data bus lines DBZ0 and DBX0.

The global bit line GBLZ0, taken as an example, is formed into a hierarchical structure together with a plurality of local bit lines LBLZ00 and LBLZ10. FIG. 6 exemplifies the hierarchical structure of two local bit lines LBLZxx and a single global bit line GBLZx. A pair of local bit lines LBLZxx are laid in parallel with respect to the associated global bit line GBLZx.

The local bit lines LBLZ00 and LBLZ10 are connected to associated local-bit-line select transistors TG. The select transistors TG are independently controlled by local-bit-line select signals ΦSL0 and ΦSL1, respectively. That is, only the local bit line which is to be connected to the memory cells on a selected word line is connected to the associated global bit line by the enabled select transistor TG. Therefore, it is only the global bit line and the selected, partial local bit line that will be the bit lines to be connected to the associated sense amplifier, and the time constant of the bit line becomes small. In the example in FIG. 6, one of the pair of upper and lower local bit lines LBLZ00 and LBLZ10 is connected to the global bit line GBLZ0.

The portion of the global bit line GBLZ0 which lies ahead of the select transistor TG to the local bit line that is located farthest from the associated sense amplifier SA is cut. The capacity of the global bit line therefore becomes smaller by cutting the portion.

The reset circuit for the global bit line has an equalize transistor GBLEx for short-circuiting the left and right global bit lines GBLZ0 and GBLX0, and a precharge transistor GBLRx for precharging the global bit line GBLZx to a precharge level VR. Particularly, the precharge transistor GBLRx, even if having a large size, can be located at any position on the global bit line because of the sufficient pitch between the global bit lines secured by the bit line hierarchical structure. Increasing the size of the precharge transistor GBLRx can allow a precharging global-bit-line reset signal ΦBPLx/BPRx even of a one-shot pulse to sufficiently precharge the global bit line to the precharge level VR.

The local-bit-line reset circuit, which is provided for each local bit line LBLZxx, has a precharge transistor LBLRx for precharging the local bit line to the precharge level VR. It is however to be noted that the reset circuit for the local bit line LBLZ10 is not shown in this figure. The provision of the reset transistor for each local bit line can allow the nonselected local bit lines to be maintained at reset level so as to permit only a selected local bit line to be reset to the precharge level by the sense amplifier in a subsequent standby mode, and thus contributes to reducing power dissipation.

The precharge transistor LBLRx is provided to compensate for a leak when the standby state is long, and the transistor width is set as small as not to affect the standby current even when the local bit line is short-circuited with another potential. For example, designing the precharge transistor smaller than the cell transistor allows only a current of several $\mu A$ to flow. It is thus possible to reset the local bit line and detect a short-circuiting failure of the local bit line. When the local bit line has a short-circuiting failure, the level of the local bit line in standby mode does not sufficiently become the reset level due to the small size of the precharge transistor and malfunction should occur, so that the short-circuiting failure can easily detected. Further, a reduction in the precharge level VR which would otherwise be caused by the short-circuiting failure does not occur because of the small size of the precharge transistor.

Figure 7:
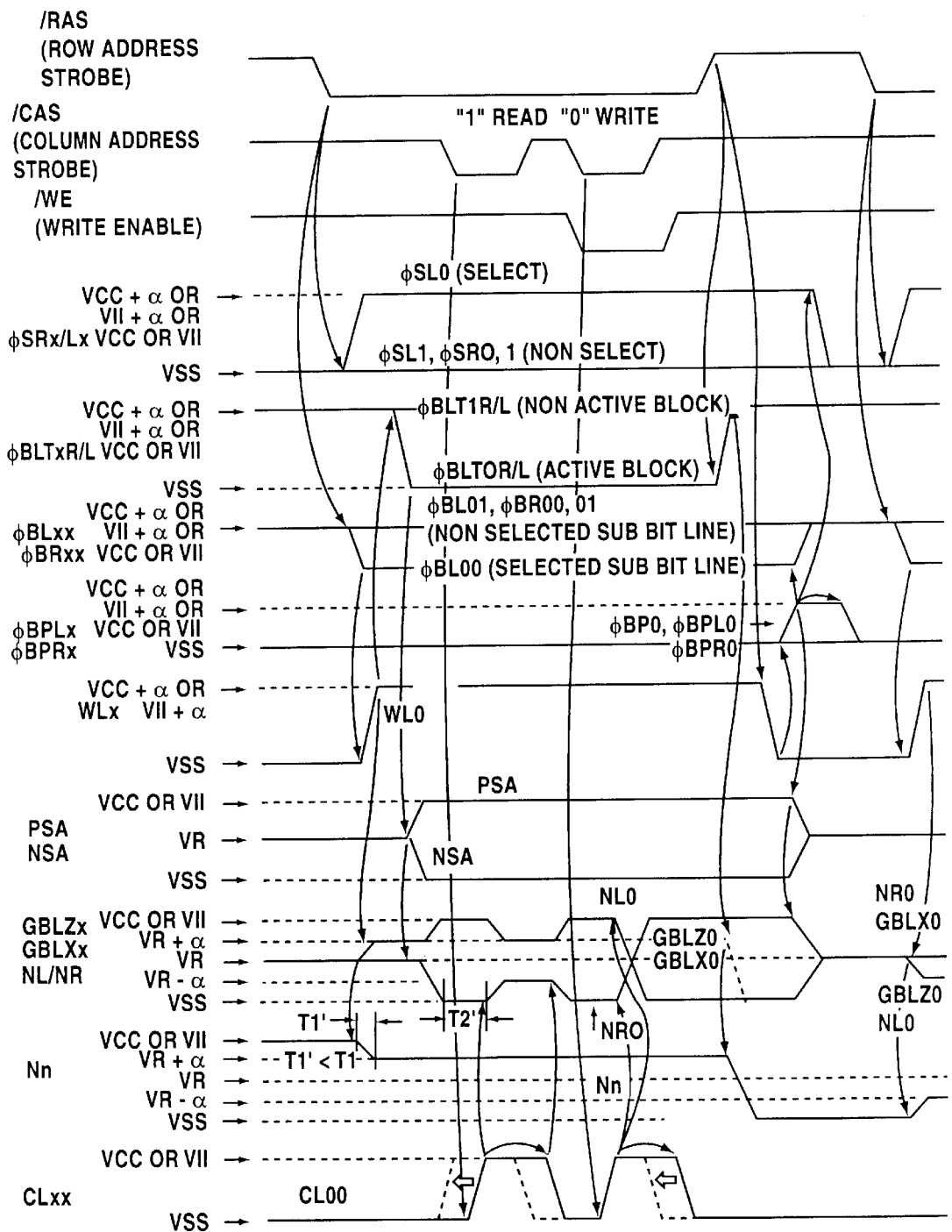
FIG. 7 is an operational waveform chart in a case where "1" is read from the memory in FIG. 6 and "0" is written there.

FIG. 7 is a diagram of operational waveforms when "1" is read from the memory in FIG. 6 and "0" is written there. The operation will be discussed with reference to this operational waveform chart. For the sake of simplicity, hereinafter, the global bit lines will be called main bit lines and the local bit lines will be called sub bit lines.

First, in standby mode where a row address strobe signal/RAS has an H level, sub-bit-line reset signals ΦBLxx and ΦBRxx are at an H level, and all the sub-bit-line reset transistors LBLRx are enabled to be charged to the reset potential VR. Note that as illustrated, the "H level" here may be either an external supply voltage Vcc or an internal supply voltage Vii, or either Vcc+ or Vii+. Note also that the main-bit-line reset signals ΦBPLx and ΦBPRx have already been reset by the one-shot pulse at the beginning of the standby mode.

Furthermore, all the sub bit lines are isolated from the main bit lines. The bit-line transfer transistors BLT are all conductive so that the main bit lines are connected to the associated sense amplifiers. The sense amplifier drive signals PSA and NSA are both at the VR level, and the sense amplifiers are in a disabled state.

When the row address strobe signal/RAS goes to an L level from the H level, the memory become active. In the active state, the sub-bit-line reset transistors LBLRx of a selected block are cut off. Alternatively, only the sub-bit-line reset transistors LBLRx for the sub bit lines to which the memory cells on a word line WLx to be selected will be connected to may be cut off, for the operation current can be reduced more in that case. At the same time, a single sub-bit-line select signal (ΦSL0, ΦSR0 here) goes to "high" or "super high" in order to connect the sub bit lines LBLZx which are to be connected to the memory cells on the word line to be selected to the corresponding main bit line GBLZx.

When the word line selected by the row address (WL0 in this example) goes to "high" or "super high," the transfer transistor TNCn in the cell section is conductive so that the charges ("1" in this example) stored in the capacitor Cn flow out to the main bit line (GBLZ0 in this example) via the transistor TNCn and the sub-bit-line select transistor TG, thus producing a potential difference with respect to the opposite main bit line GBLX0 with the sense amplifier SA00 in between.

Before the sense amplifier SA00 operates, the bit-line transfer signals ΦBLT0L and ΦBLT0R become an L level or Vss, and the bit-line transfer transistor BLT is cut off, isolating the sense amplifier from the main and sub bit lines.

Under this situation, the sense amplifier drive signals NSA and PSA respectively change to an L level (Vss) and an H level (Vcc or Vii level) from the potential level VR, amplifying the levels of sense amplifier nodes NL0 and NR0. Likewise, the levels of sense amplifier nodes NL1 and NR1 are also amplified, though not illustrated. Because the bit-line transfer transistor BLT is cut off, noise caused by this amplification is not transferred to the bit lines. The noise does not therefore affect the amplifying operation of the adjoining sense amplifier via the main and sub bit lines or the cell plate. As illustrated in FIGS. 3 through 5, the interconnection lines formed of the material for the main bit line (those portions indicated by the nodes NL0, NR0, NL1 and NR1 in this example) are capacitatively isolated from the adjoining sense amplifier by the shield layer (Vcp in FIG. 3) which is set to the fixed potential of the cell plate or the like, they are not affected by the coupling noise originated from the transfer lines which are formed of the material for the main bit line. This can ensure a stable amplifying operation.

Because a so-called failed bit line which is, for example, short-circuited to another node, is weakly reset as mentioned earlier, the level of the failed bit line is close to the potential of the short-circuited node and is not equal to the potential of a bit line to be compared with, so that erroneous reading easily occurs. It is therefore possible to easily detect a failed bit line which is difficult to be made redundant or be rejected by the prior art. This makes it possible to prevent an operational failure or an increase in standby current, which should be likely to occur by a future drop in the resistance of any short-circuited portion, thus improving the reliability of the device.

When the amplification by the sense amplifier is completed or after the amplification progresses for a certain time, a column select signal (CL00 in this example) is enabled in response to the falling of a column address strobe signal/CAS. The enabled column select signal CL00 turns on column gates CGX0 and CGZ0, causing information in the sense amplifier to be output onto the data bus lines DBZ0 and DBX0.

The sequence from the falling of the row address strobe signal/RAS to access to the sense amplifier via the column gates is faster than that in the prior art. This is because the time constant of the bit lines when the upper and lower hierarchical bit line system is used is smaller than the time constant of the bit lines in the case where all the cells in the column direction are connected, thus quickening the transfer of cell information to the sense amplifier. The isolation between the sense amplifier from the main bit lines contributes to speeding up the amplifying operation of the sense amplifier in read mode and the writing operation becomes faster in reverse write mode because there are no apparent loads of the main and sub bit lines.

In write mode after reading is completed, an unillustrated write amplifier inverts the status of the sense amplifier via the data bus lines DBZ0 and DBX0. At this time, as the main bit lines are cut off from the sense amplifier, the nodes NL0 and NR0 of the sense amplifier alone are inverted and the levels of the main bit lines GBLZ0 and GBLX0 are not inverted, as shown a broken line FIG. 7.

When the read and write operation is competed and the row address strobe signal/RAS rises, the word line is reset. As the sense amplifier is isolated from the main bit lines in this embodiment, rewriting to the cells should be carried out before resetting the word line. This necessitates the bit-line transfer transistor BLT to be turned on again by raising ΦBLTxL, ΦBLTxR. Consequently, the levels of the main bit lines GBLZ0 and GBLX0 are amplified to an H level and L level for the first time.

When rewriting to the cells is finished, the word line WL0 is reset to an L level. Then, a bit-line equalize signal ΦBP0 is input in a pulse form to set the sense amplifier nodes NL0 and NR0 to the equal potential. Thereafter, bit-line reset signals ΦBPL0 and ΦBPR0 of pulse waveforms similar to that of the equalize signal ΦBP0 are input to set the main and sub bit lines to the bit-line reset potential VR. Further, a sub-bit-line reset signal ΦBL00 becomes an H level to compensate for the reset potential VR of the sub bit lines in a subsequent standby period.

Further, the sub-bit-line select signal ΦSL0 is dropped to close the select transistor TG. The sense amplifier drive signals PSA and NSA are returned to the reset potential VR.

In the memory in FIG. 6, after reading or writing is completed, the bit-line transfer transistors BLTxL and BLTxR on both sides of the sense amplifier are both conductive to drive both of the main bit lines GBLZ0 and GBLX0. However, only the bit-line transfer transistors BLTxL which are associated with the selected word line may be driven instead.

Figure 8:
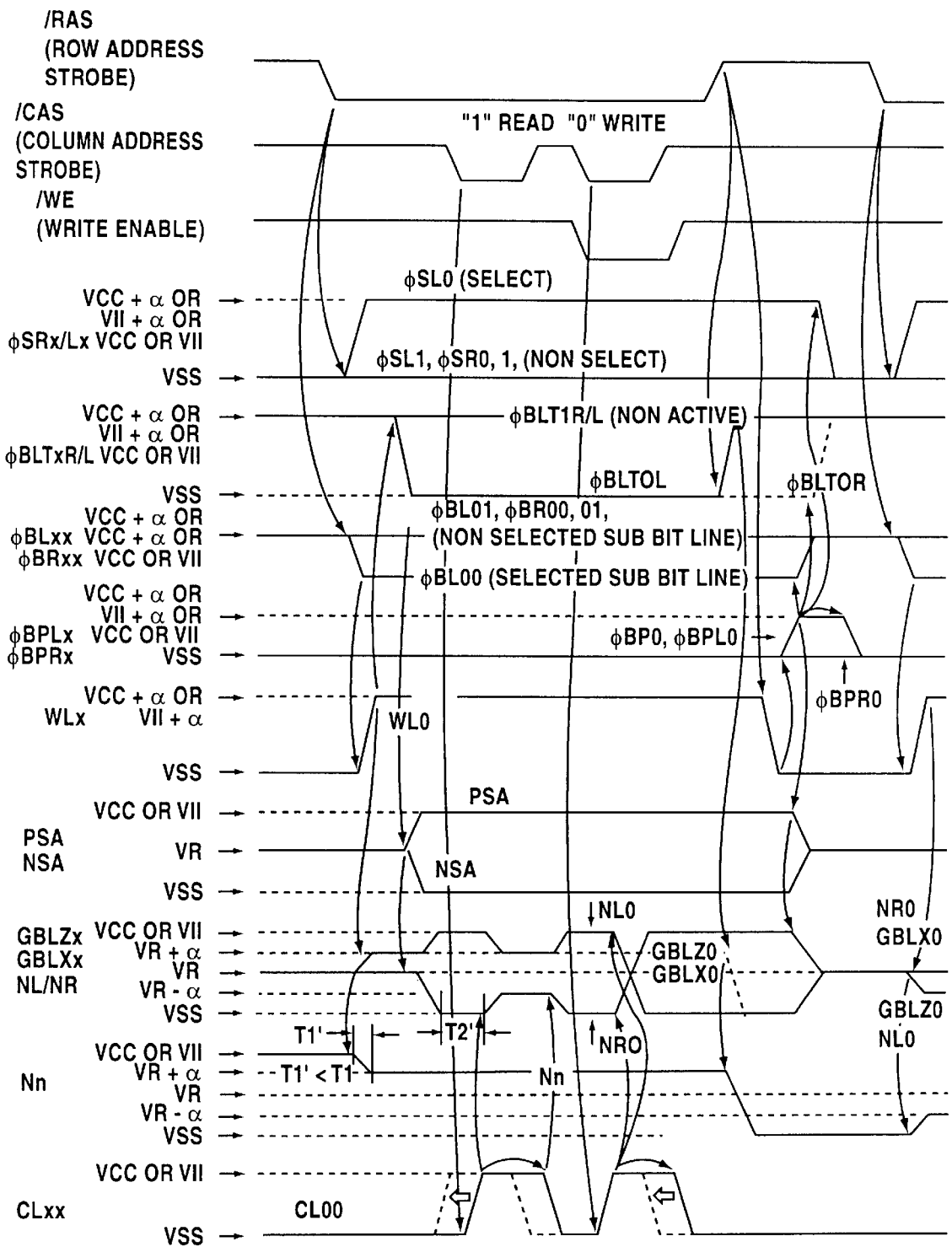
FIG. 8 is a signal waveform chart illustrating an operation of enable bit lines on one side.

FIG. 8 is a signal waveform chart illustrating an operation of driving such one-side bit lines. This operation differs from the operation in FIG. 7 in that only the bit-line transfer transistor BLT0L on that side of the word line WL0 is conductive before the word line WL0 is dropped. The bit-line transfer transistor BLT0R on the side where the selected word line is not present is conductive with some delay in the standby period. Thus, the main bit line GBLZ0 is set to an L level, and the opposite main bit line GBLX0 is kept at the reset level.

According to this invention, as described above, only the bit-line transfer transistor BLT on the side where the selected word line exist may be turned on. This is because the levels of the sense amplifier nodes NL0 and NR0 are sufficiently amplified and the total capacity of the main and sub bit lines is made smaller than that of the prior art, so that rewriting can be executed stably.

This can apply to the sub-bit-line select signal ΦSRX/SLx on the side where there is no selected word line in read mode, and the sub-bit-line select signals ΦSRx and ΦSLx for the main bit lines on the side where no word line is selected may be disabled during the active period. As a result, the sub bit lines LBLXxx are not connected to the main bit lines GBLXxx on the side where no word line is selected, thus further reducing dissipation power.

With regard to the bit-line reset signal ΦBPL, ΦBPR in standby mode, the level of only the main bit line GBLZ0 on one side is amplified and the other main bit line GBLX0 remains at the reset potential VR, the other bit-line reset signal ΦBPR0 need not be output. Then, the sub-bit-line reset signals ΦBL00, ΦBL01, ΦBR00 and ΦBR01 which have been cut off are enabled to carry out compensation for a minute leak to be ready for the next active operation. Since the reset signals for the sub bit lines for which no word line is selected in active mode, i.e., the signals ΦBL01, ΦBR00 and ΦBR01 in this example, are not set to an L level in active mode, and thus need not be set anew to an H level.

Generally speaking, from the viewpoint of reducing dissipation power, operational signals should be reduced as much as possible. For example, even for a scheme of amplifying the levels of the main bit lines on both sides of a sense amplifier in the open bit line system, current consumption can be reduced more if the reset signals and select signals for the sub bit lines for which no word line is selected are not disabled or enabled.

Although this embodiment uses more main-bit-line reset transistors GBLRx than the prior art, those transistors can be laid out with twice the margin for the conventional bit-line reset circuit because they should be arranged at a pitch equivalent to the pitch of two sub bit lines. This is true of the sub-bit-line selector. If the sub-bit-line reset transistors LBLRx, having the same drain and gate, are arranged together, the sub-bit line reset transistors can be laid out at double the pitch of the cell transfer transistors. This can reduce the O-resistance of the sub-bit-line reset transistors.

Second Embodiment

Figure 9:
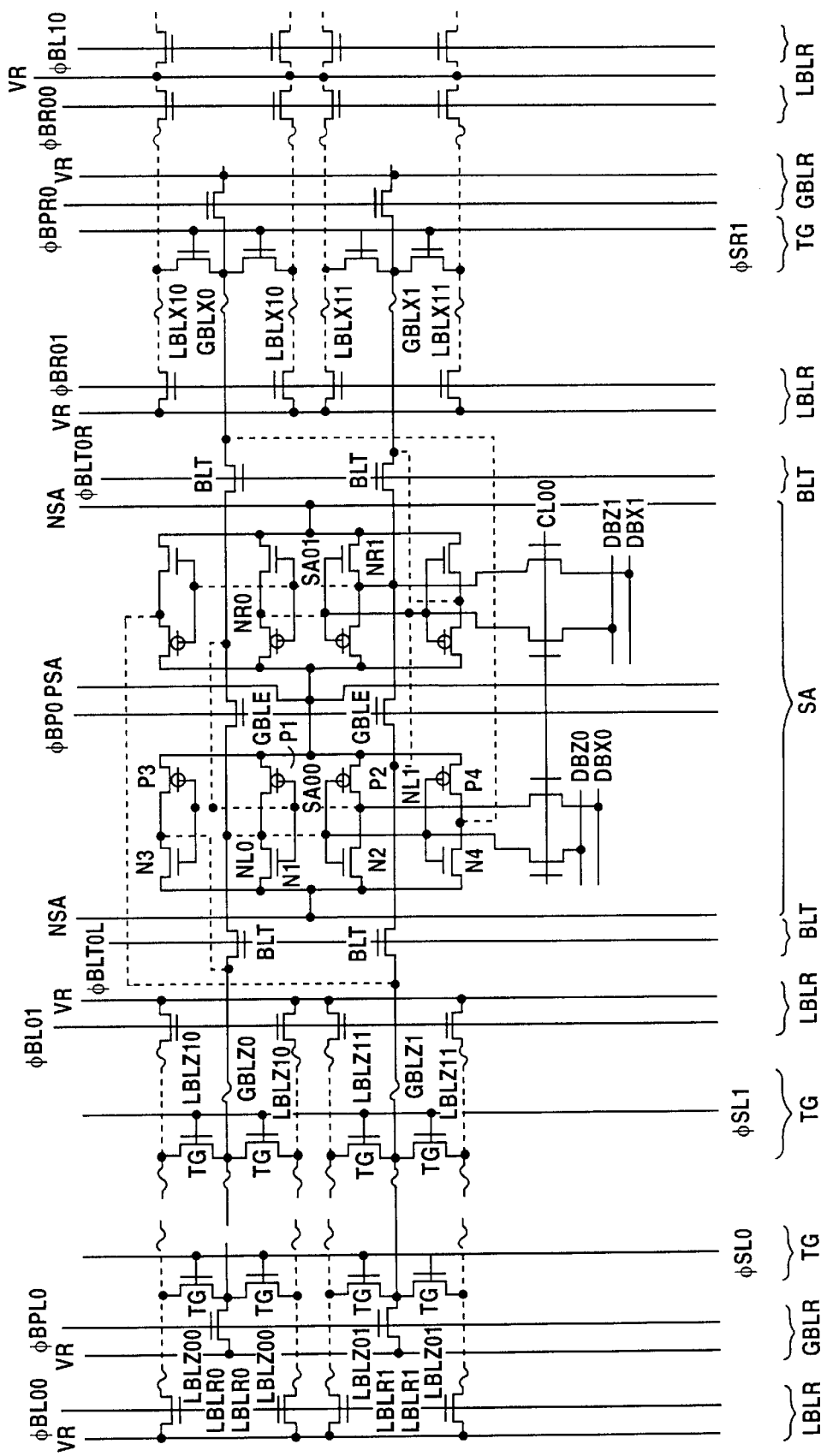
FIG. 9 is a memory circuit diagram according to a second embodiment.

FIG. 9 is a memory circuit diagram of the second embodiment. FIG. 9 shows the sense amplifier section in a memory block, the main bit lines GBLZx, GBLXz and sub bit lines LBLZxx, LBLXxx on both sides of the sense amplifier section SA, and reset circuits CBLR, LBLR and selectors TG for those main and sub bit lines, with memory cells MC, word lines WLx and the like unillustrated in the figure.

The second embodiment differs from the first embodiment in the additional provision of a CMOS inverter (rewrite amplifier) which amplifies received signals at the nodes NLx and NRx in the sense amplifier SA that are to be amplified by this sense amplifier, and amplifies the inputs to drive the associated main bit lines. The inverter comprising transistors P4 and N4 has the node NL0 as its input terminal, and inverts the main bit line GBLX0. The inverter comprising transistors P3 and N3 has the node NR0 as its input terminal, and inverts the main bit line GBLZ0. After amplification by the sense amplifier SA, therefore, the bit-line transfer transistor BLT does not have to be conductive again after sense amplification. As the main bit lines GBLZx, GBLXx are inverted by the inverters whose inputs are the nodes NL0 and NR0 that are driven by the sense amplifier, noise-originated erroneous reading on the bit lines can be avoided. Further, the load of the sense amplifier in write mode can be lessened. Note however that the operation for data rewriting by driving only the bit lines on one side as illustrated in FIG. 8 is not possible and the bit lines on both sides are always driven by a pair of inverters.

Figure 10:
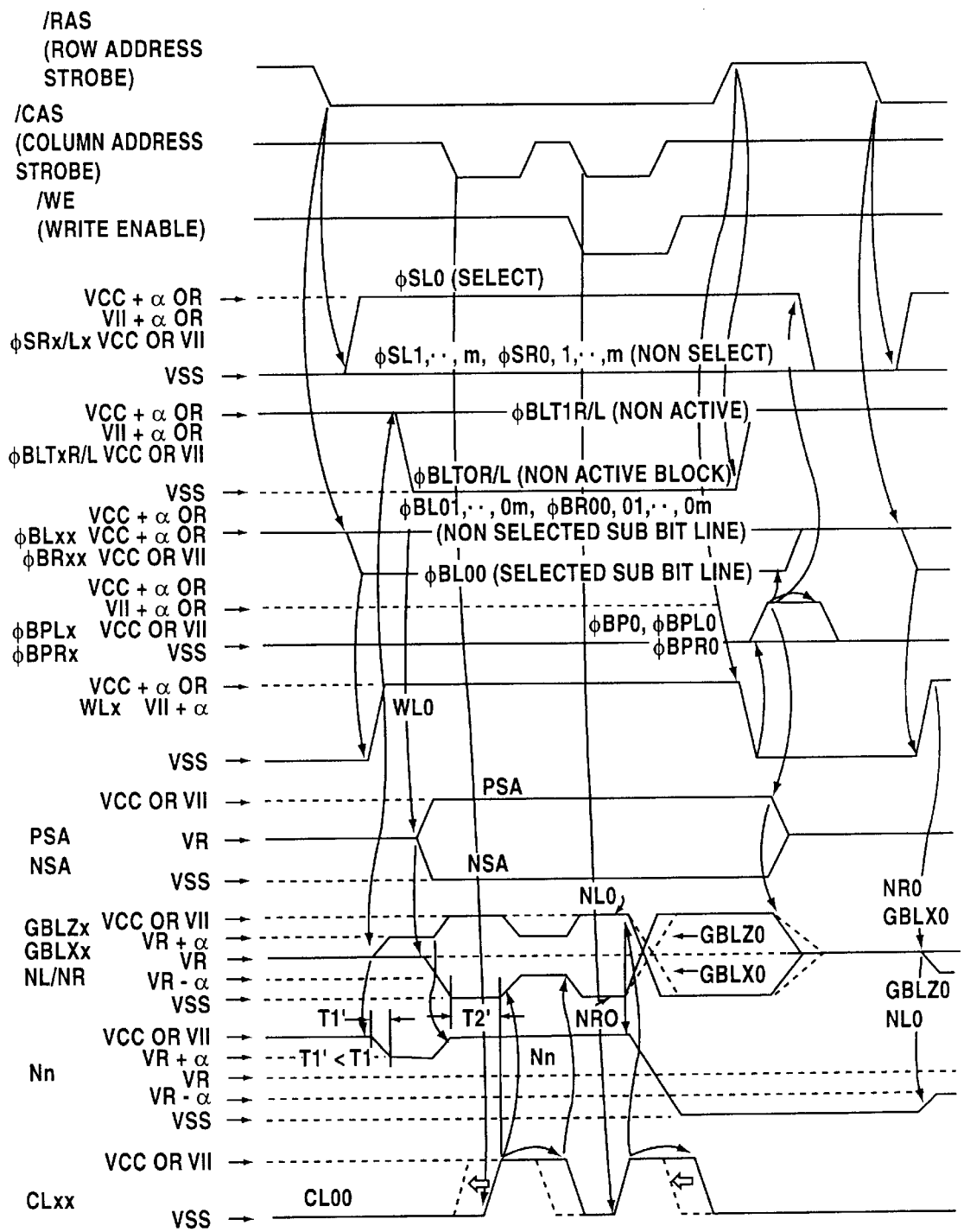
FIG. 10 is a signal waveform chart illustrating the operation of the memory in FIG. 9.

FIG. 10 is a signal waveform chart illustrating the operation of the memory in FIG. 9. This operation differs from the one shown in FIG. 7 in that when the sense amplifier drive signals PSA and NSA go to the enable levels and the sense amplifier starts amplification, the levels of the main bit lines GBLZ0 and GBLX0 on both sides are amplified by the inverters as indicated by the broken lines as the levels of the nodes NL0 and NR0 are amplified. When the column select signal CL00 rises at the time of writing "0," the sense amplifier is inverted, thus inverting the levels of the nodes NL0 and NR0 and the levels of the main bit lines. During that period, the bit-line transfer transistors BLT all remain disabled (nonconductive). Thus, the load of the sense amplifier is reduced and the sense amplifier is not affected by noise which appears on the bit lines. As driving the bit lines is performed at an early stage, a change in the level of the cell node Nn in a memory cell becomes faster as compared with the operation in FIG. 7.

Figure 11:
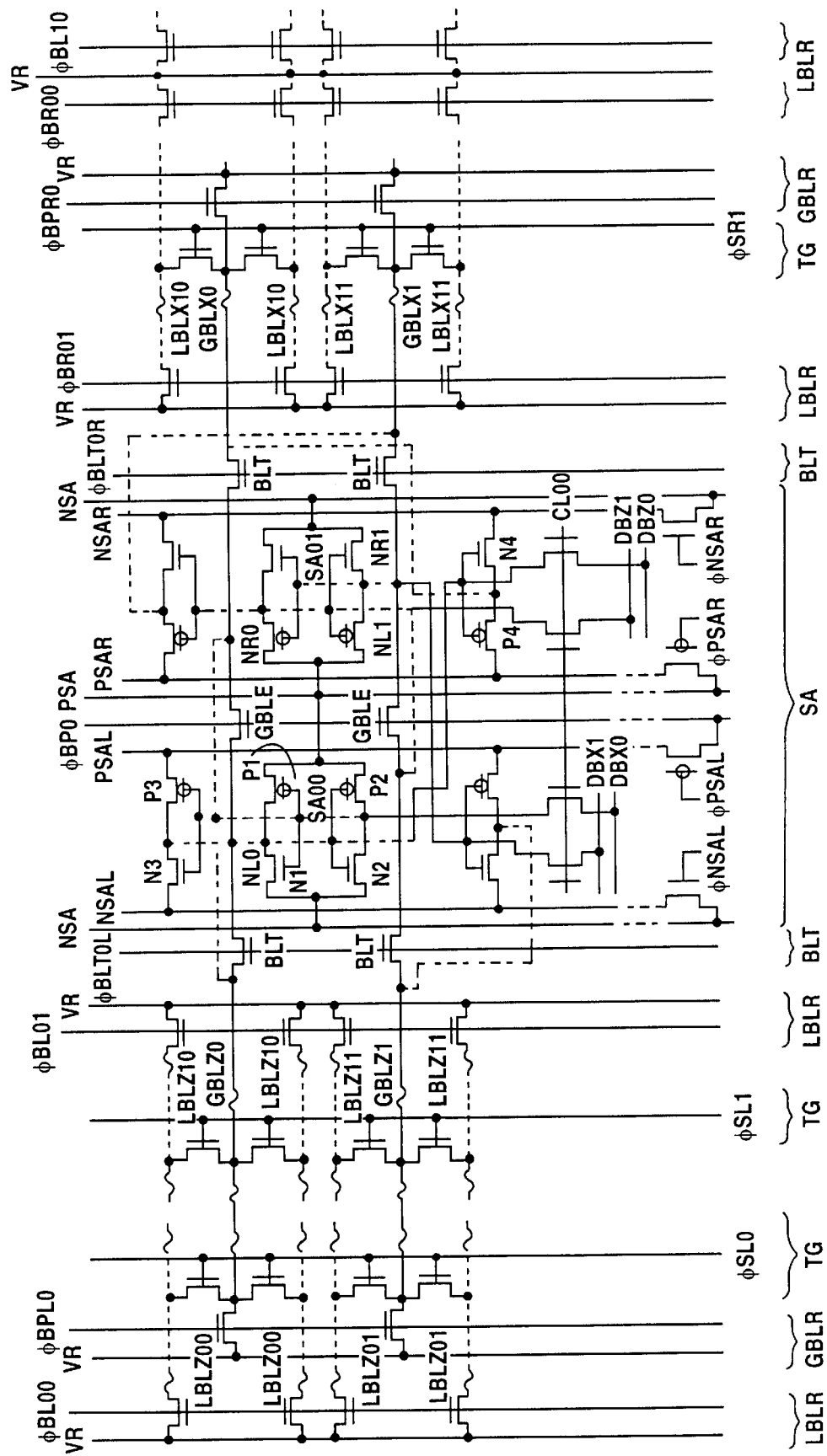
FIG. 11 is a diagram showing a memory circuit according to a modification of the second embodiment.

FIG. 11 is a diagram showing a memory circuit according to a modification of the second embodiment. In this modification, the right and left inverters (N3, P3 and N4, P4) which are the aforementioned rewrite amplifiers are designed to be operable selectively so that only the bit lines on one side are driven in rewrite mode, as shown in FIG. 8. For this purpose, inverter drive signals PSAL/R and NSAL/R are produced in addition to the sense amplifier drive signals PSA and NSA.

Figure 12:
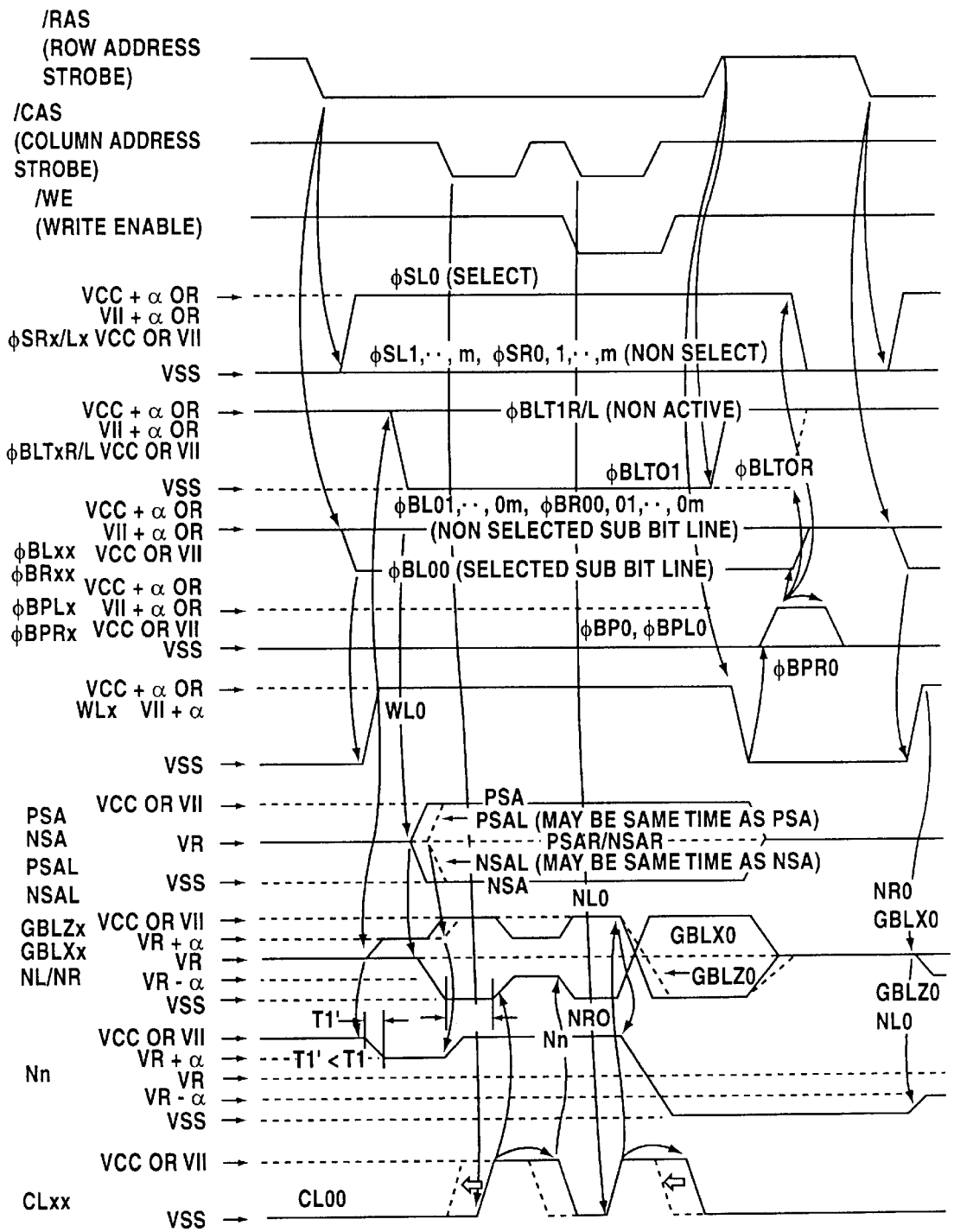
FIG. 12 is a signal waveform chart illustrating the operation of the memory in FIG. 11.

FIG. 12 is a signal waveform chart illustrating the operation of the memory in FIG. 11. If a word line for the left cell array is selected, the bit line drive for data rewriting is performed only on the left main bit line GBLZ0. As shown in FIG. 12, therefore, at the same time as, or with some delay from, the enabling of the sense amplifier drive signals PSA and NSA, the drive signals PSAL and NSAL for the inverter which drives the left main bit line GBLZ0 are enabled. Accordingly, the left main bit line GBLZ0 is set to an H level by the inverter which comprises the transistors P3 and N3, and the right main bit line GBLX0 is kept at the reset potential VR. In write mode too, the left main bit line GBLZ0 alone is set to an L level.

In this modification, as only the bit lines on one side are driven, dissipation power can be suppressed. As the bit lines on the side where the selected word line is not present are kept at the reset potential VR, the reset operation of resetting those bit lines to the reset level is unnecessary.

Third Embodiment

Figures 13, 13A:
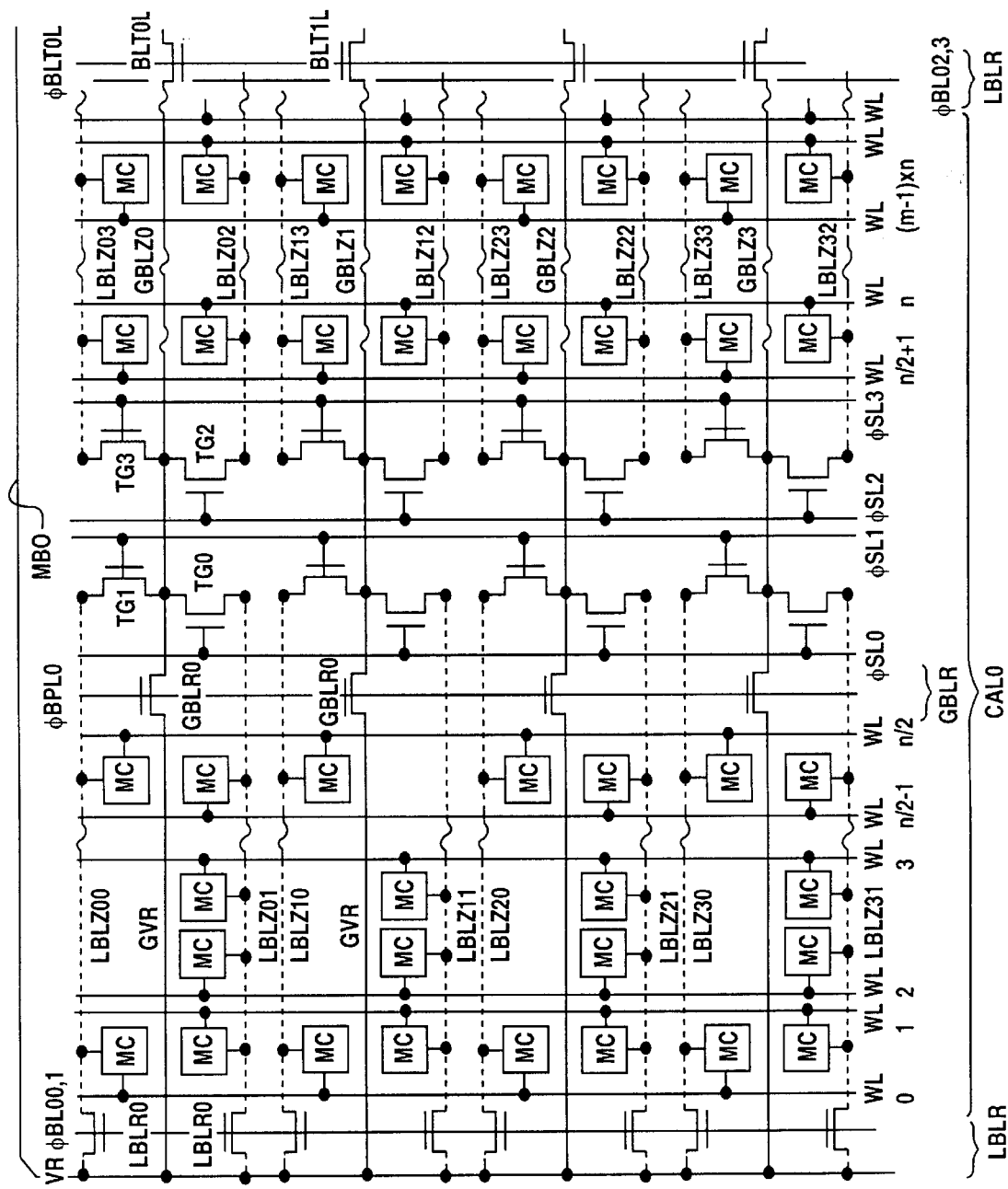
FIG. 13 is a diagram of a memory circuit according to a third embodiment.
Figure 13B:
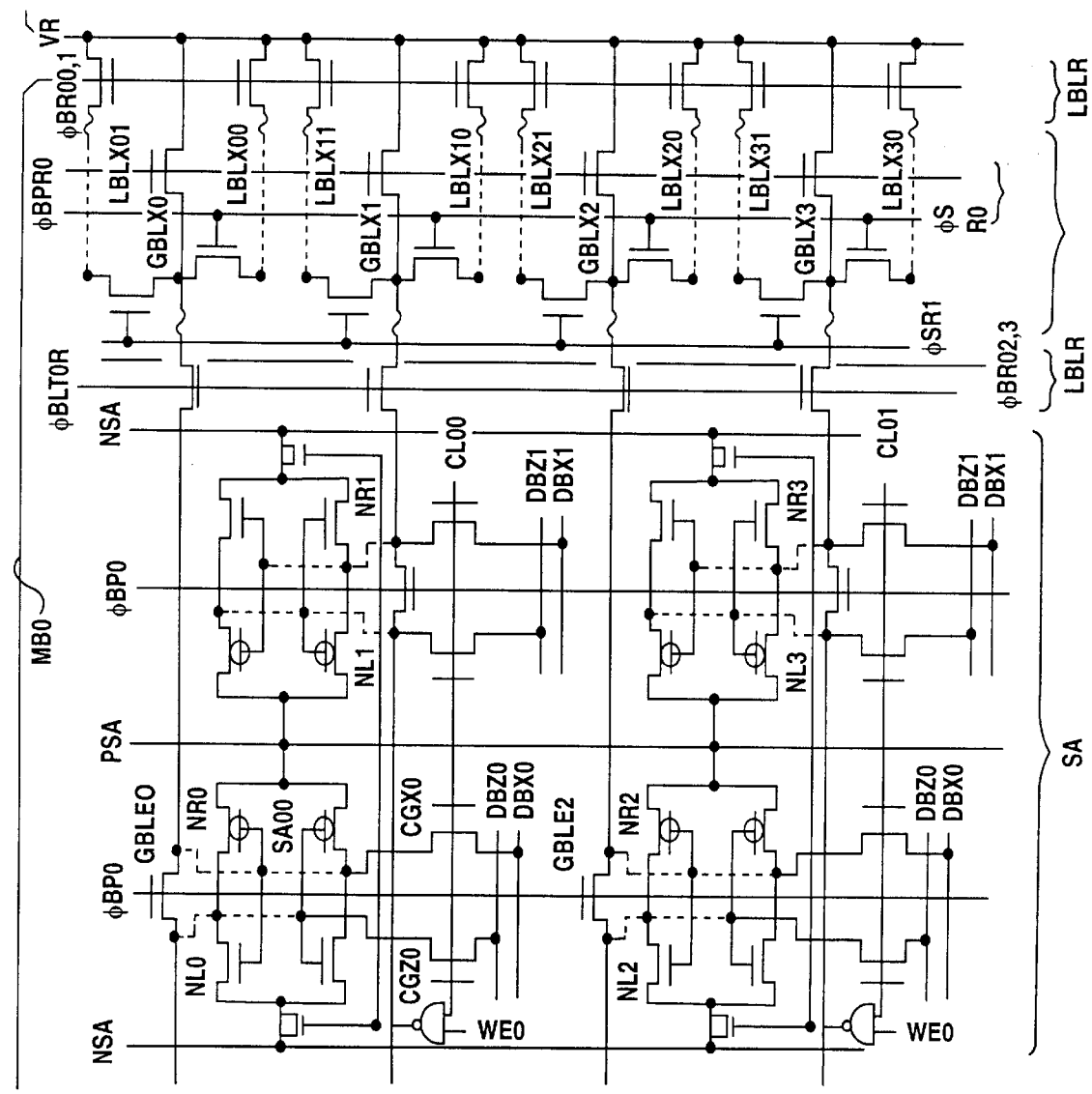

FIG. 13 is a memory circuit diagram of the third embodiment in which four sub bit lines LBLZ00 to LBLZ03 can be selected individually, two for respectively above and under the main bit line GBLZ0 and two for respectively right and left thereof. Sub-bit-line selectors TG0 which are driven by selection signal ΦSL0–ΦSL3 to TG3 and a main-bit-line reset circuit GBLR are laid out at the center of the cell array CAL0, and the main bit line GBLZ0 is cut at the main-bit-line reset circuit portion by the reset circuit GBLR. The capacity of the main bit line GBLZ0 is therefore about a half of that in the case where the main bit line is not cut. Lines GVR which are formed of the same material as that of the main bit line and extend to the main-bit-line reset circuit GBLR from both ends in the figure are provided to keep the continuity of the layout pattern of the main bit line GBLZ0. The lines GVR may be floating, but may be set to a fixed potential like the reset potential VR as illustrated. In this case, connecting the lines GVR to the reset transistors GBLR0 eliminates the need for the lines for the main-bit-line reset potential VR which are laid in the direction of word lines in FIG. 6, resulting in an advantage that the layout loss in the bit line direction is eliminated.

The other circuit structure than the above-described one is the same as that in FIG. 6, and the structures of the sense amplifiers shown in FIGS. 9 and 10 can be adapted to this embodiment. As four sub bit lines can be selected individually, the entire capacity of the bit lines to be connected to the memory cells can be suppressed and the read sensitivity can be improved.

Figure 14:
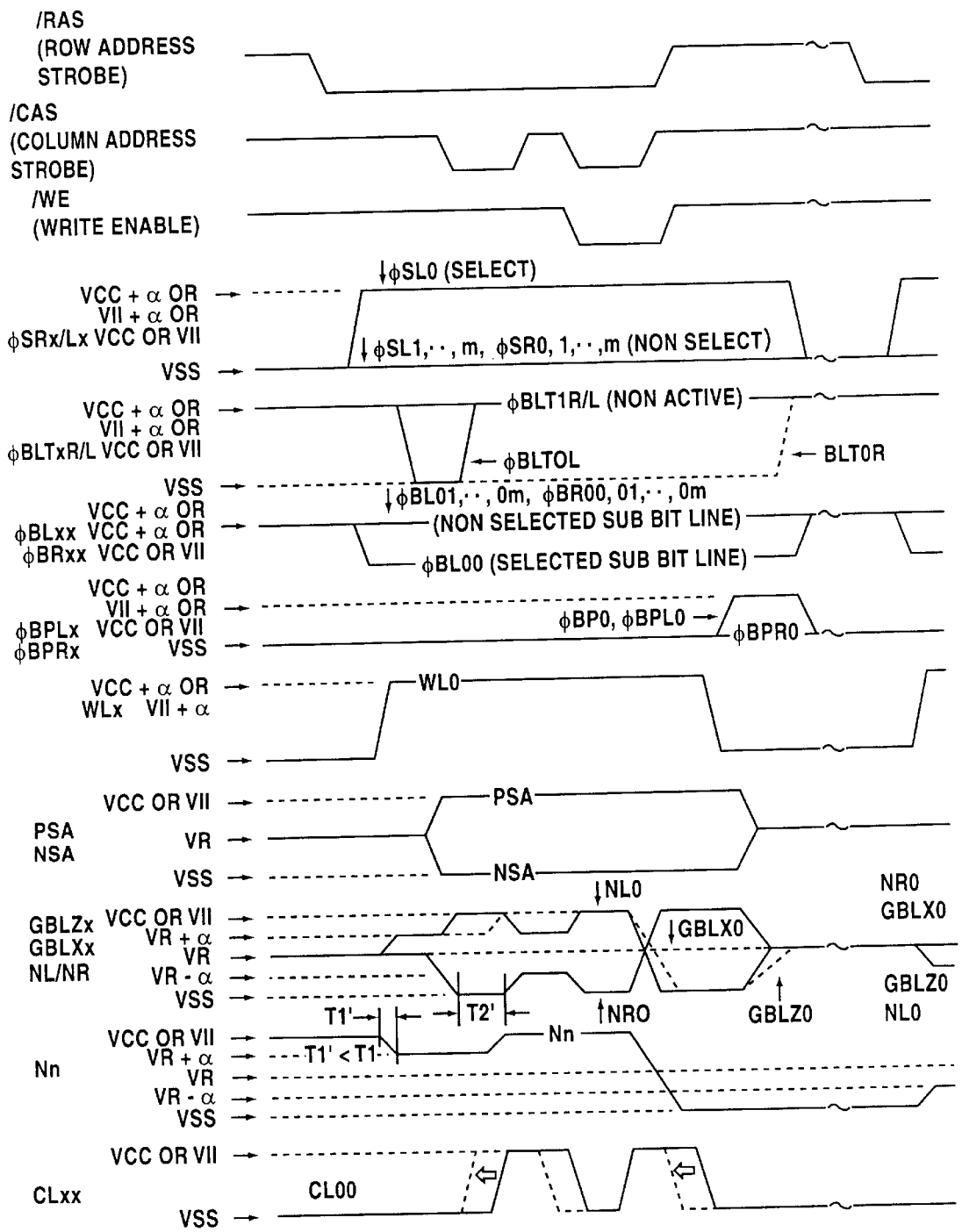
FIG. 14 is a signal waveform chart illustrating the operation of the memory in FIG. 13.

FIG. 14 is a signal waveform chart illustrating the operation of the memory with the suppressed capacity of main bit lines shown in FIG. 13. This feature of this operation lies in that control of the bit-line transfer transistor is carried out in such a way that in the amplification by the sense amplifier, the transfer transistor is closed to avoid the problem of noise on the bit lines, and once the amplification by the sense amplifier has been completed, the bit-line transfer transistor on that side of the selected word line is opened to drive the bit lines. The main bit line is cut in the vicinity of the center, and the minimum sub bit lines necessary alone are connected to the main bit line to suppress the capacity of the whole bit lines connected to the sense amplifier and to ensure bit line driving by the sense amplifier. The bit lines on the reference side are left isolated from the sense amplifier by keeping the bit-line transfer transistors closed. As a result, the reset operation of resetting the bit lines on the reference side becomes unnecessary.

As shown in FIG. 14, as the bit-line transfer transistors BLT0L and BLT0R are closed and the sense amplifier drive signals PSA and NSAA are enabled, the sense amplifier senses the potential difference between the nodes NL and NR and amplifies the levels of both nodes. After the levels of the nodes NL and NR are sufficiently amplified, the bit-line transfer transistor BLT0L on the left side where the selected word line is present is conductive. Consequently, the left bit line GBLZ0 alone is driven by the sense amplifier. The potential of the right bit line GBLX0 is kept at the reset level VR.

In write mode, desirably when the bit lines are driven via the data bus lines DBZ0 and DBX0 by an unillustrated write amplifier, the sense amplifier which is to be connected to the data bus lines DBZ0 and DBX0 is disabled by a write enable signal WE and the selected column select signal CL00 to thereby drive the selected bit line. Thereafter, the sense amplifier is enabled. As the capacity of the bit lines is suppressed, the bit lines can be driven fast directly by the write amplifier.

As discussed above, the use of a pair of sub bit lines lying above and under a main bit line as in this invention can ensure a lot of design variations. Increasing the number of the sub-bit-line selectors and the number of sub-bit-line reset circuits can permit the sub bit lines to be individually connected to the associated main bit line or to be individually connected to the reset voltage. It is possible to realize a structure where 512 cells can be laid on each main bit line or a structure where 1024 cells can be laid on each main bit line. Since a plurality of main-bit-line reset circuits can be laid midways of each of the main bit line, even if multiple cells as mentioned above are laid on the bit lines, this invention exhibits an advantage of shortening the reset period for the bit lines.

This can be adapted to a DRAM family such as SDRAM (Synchronous DRAM) having DRAM cells and RDRAM (RAM bus DRAM) as well as semiconductor memory devices having other cell structures like SRAM. Although the cell select transistors, main/sub-bit-line reset circuits, main-bit-line transfer transistors, etc. are comprised of N-channel transistors in the embodiments of this invention, they may of course be replaced with P-channel transistors. In addition, the sub bit lines may be formed over cells or may be formed under cells or in the substrate. While it is typical to basically form the main bit lines above cells, they may be formed under cells or in the substrate. This invention can also be adapted to cope with various layouts inside and outside a sense amplifier.

As apparent from the above, this invention can reduce the chip size, speed up the operation and reduce dissipation power particularly in standby mode without increasing a difficulty in the manufacture of a large-capacity semiconductor memory device. This invention can therefore improve the performance of semiconductor memory devices and reduce the cost thereof, and significantly contributes to improving the reliability.

As this invention employs the hierarchical bit line structure with an enhanced memory cell layout efficiency and the bit lines are isolated from the associated sense amplifier by the bit-line transfer transistors, the invention can provide a semiconductor memory device which is unsusceptible to noise in read mode. Further, by the use of the bit-line transfer transistor to connect the bit lines on the selected word line side to the sense amplifier and drive those bit lines, the levels of the bit lines on the reference side can be kept at the reset potential and dissipation power can be suppressed accordingly.

Furthermore, as the reset circuits are provided at the main bit lines and the sub bit lines, only the sub bit lines which are to be connected to the selected memory cells can be connected to the associated main bit line and then reset. This considerably contributes to suppressing the capacity of the bit lines to be driven and reducing dissipation power.

Moreover, the main-bit-line reset circuit set only the driven main bit line and sub bit lines to the reset potential, therefore transistors of a small size are used for the sub-bit-line reset circuit, so that the leak current produced by a failed bit line can be suppressed accordingly.

What is claimed is:

1. A semiconductor memory device comprising:

a plurality of word lines extending in a row direction;

a plurality of global bit lines extending in a column direction;

local bit lines belonging to said global bit lines and divided into groups in said column direction, a plurality of local bit lines being arranged in said row direction with respect to each global bit line;

a plurality of memory cells provided at intersections of said word lines and said local bit lines;

a plurality of sense amplifiers each for comparing signal levels of an associated pair of global bit lines located on both sides thereof in said column direction;

bit-line transfer circuits, provided between said global bit lines and said sense amplifiers, for isolating said global bit lines from said sense amplifiers when said sense amplifiers are driven;

global-bit-line reset circuits, respectively provided for said global bit lines, for driving said global bit lines to a reset level; and local-bit-line reset circuits, respectively provided for said local bit lines, for driving said local bit lines to said reset level, wherein said global-bit-line reset circuits drive local bit lines to be connected to memory cells on a selected word line to said reset level.

2. The semiconductor memory device according to claim 1, further comprising a local-bit-line selector for connecting local bit lines to be connected to memory cells on a selected word line, to the associated global bit lines, wherein said sense amplifiers are supplied with signals from the local bit lines to be connected to said memory cells on said selected word line and the global bit lines connected to said local bit lines on one side of said sense amplifiers and reference signals from opposite global bit lines with respect to said sense amplifiers.

3. The semiconductor memory device according to claim 2, wherein said sense amplifiers amplify input signals, then drive said local bit lines to be connected to said memory cells on said selected word line and the global bit lines connected to said local bit lines, and said opposite global bit lines being kept at a reference level.

4. The semiconductor memory device according to claim 1, wherein in a standby period, said global-bit-line reset circuits drive said global bit lines by a pulse signal in a short period, and said local-bit-line reset circuits keep said local bit lines at said reset level in a longer period than said short period.

5. The semiconductor memory device according to 1, wherein said local-bit-line reset circuits have reset transistors each provided between a reset potential and an associated one of said local bit lines, said reset transistors having a substantially same as or a smaller size than transistors of said memory cells.

6. The semiconductor memory device according to claim 1, further comprising a local-bit-line selector for connecting local bit lines to be connected to memory cells on a selected word line, to the associated global bit lines; and wherein said global bit lines are cut in a vicinity of said local-bit-line selector at a farthest position from said sense amplifiers.

7. The semiconductor memory device according to claim 6, wherein an extending wire pattern equal in pattern to said cut global bit lines is arranged in said column direction, said extending wire pattern is set to a reference potential, and said global-bit-line reset circuits are provided between said global bit lines and said extending wire pattern.

8. The semiconductor memory device according to claim 1, wherein each of said sense amplifiers has a read amplifier for receiving at an input terminal a signal from the associated one of said global bit lines and amplifying said input signal, and a rewrite amplifier for receiving at an input terminal an output signal of said read amplifier and producing an output for driving said associated global bit line.

* * * * *